(12) United States Patent
Kim et al.

(10) Patent No.: US 7,588,972 B2
(45) Date of Patent: Sep. 15, 2009

(54) THIN FILM TRANSISTOR, METHOD OF MANUFACTURING THE SAME, DISPLAY APPARATUS HAVING THE SAME AND METHOD OF MANUFACTURING THE DISPLAY APPARATUS

(75) Inventors: Sang-Gab Kim, Seoul (KR); Shi-Yul Kim, Yongin-si (KR); Hong-Sick Park, Suwon-si (KR); Hee-Hwan Choe, Incheon (KR); Hong-Kee Chin, Suwon-si (KR); Min-Seok Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/146,763

(22) Filed: Jun. 26, 2008

(65) Prior Publication Data

US 2009/0017574 A1    Jan. 15, 2009

(51) Int. Cl.
*H01L 21/00*    (2006.01)
(52) U.S. Cl. .......................... 438/149; 438/155; 257/59
(58) Field of Classification Search ................ 438/149, 438/155; 257/59
See application file for complete search history.

(56) References Cited

U.S. PATENT DOCUMENTS 6,398,974 B1    6/2002    Kim

| 2002/0135709 | A1 | 9/2002 | Sung Chae |
| 2005/0162598 | A1 | 7/2005 | Choi et al. |
| 2005/0242401 | A1 | 11/2005 | Cho et al. |
| 2006/0131580 | A1 | 6/2006 | Yang et al. |
| 2006/0237724 | A1 | 10/2006 | Tsao et al. |
| 2007/0007522 | A1 | 1/2007 | Tsao et al. |

FOREIGN PATENT DOCUMENTS

| JP | 08-062629 | 3/1996 |
| JP | 2000-221488 | 8/2000 |

OTHER PUBLICATIONS

English Abstract, Publication No. CN, Aug. 11, 2000.
English Abstract, Publication No. JP, Mar. 8, 1996.

*Primary Examiner*—Douglas M Menz
(74) *Attorney, Agent, or Firm*—Haynes & Boone LLP

(57) ABSTRACT

A thin film transistor includes a gate electrode on a substrate, a gate insulating layer on the substrate, a channel pattern, a source electrode and a drain electrode. The channel pattern includes a semiconductor pattern formed on the gate electrode and overlaying the gate electrode as well as first and second conductive adhesive patterns formed on the semiconductor pattern and spaced apart from each other. The source electrode includes a first barrier pattern, a source pattern and a first capping pattern sequentially formed on the first conductive adhesive pattern. The drain electrode includes a second barrier pattern, a drain pattern and a second capping pattern sequentially formed on the second conductive adhesive pattern. Etched portions of the first and second conductive adhesive patterns have a substantially vertical profile to prevent the exposure of the source and drain electrodes, thereby improving the characteristics of the thin film transistor.

15 Claims, 15 Drawing Sheets

THIN FILM TRANSISTOR, METHOD OF MANUFACTURING THE SAME, DISPLAY APPARATUS HAVING THE SAME AND METHOD OF MANUFACTURING THE DISPLAY APPARATUS

CROSS REFERENCE TO RELATED APPLICATIONS

This application relies for priority upon U.S. application Ser. No. 11/232,306 filed on Sep. 20, 2005 and Korean Patent Application No. 2004-103221 filed on Dec. 8, 2004, the contents of which is herein incorporated by reference in their entirety.

BACKGROUND OF THE INVENTION

1. Field of the Invention

The present invention relates to a thin film transistor, a method of manufacturing the same, a display apparatus having the same and a method of manufacturing the display apparatus. More particularly, the present invention relates to a thin film transistor for an array substrate of a display apparatus, a method of manufacturing the thin film transistor, a display apparatus having the thin film transistor and a method of manufacturing the display apparatus.

2. Description of the Related Art

In general, a liquid crystal display apparatus includes an array substrate and a color filter substrate. The array substrate includes a thin film transistor acting as a switching device and a pixel electrode electrically connected to the thin film transistor to receive a pixel voltage. The color filter substrate includes a common electrode.

The thin film transistor includes a gate line formed with a gate electrode, a gate insulating layer for the gate line, a channel pattern on the gate insulating layer, a data line formed with a source electrode and a drain electrode.

Recently, signal lines such as the gate line, the data line, etc., have become longer due to an increase in the size of the liquid crystal display apparatus. As a result of the signal lines being longer, signals applied to the signal lines are delayed or distorted. In order to prevent the delay and distortion of the signals, the signal lines include a low-resistance metal such as aluminum (Al), aluminum alloy and the like.

However, an undesirable irregularity forms on the low-resistance metal (e.g., aluminum) when heat is applied. More specifically, when the aluminum is heated to a high temperature of about 180 degrees, concave-convex portions are formed on a surface of the aluminum due to compressive stress between aluminum atoms of the aluminum. Where the data line includes aluminum, the aluminum makes contact with a conductive adhesive layer (which may be an $N^+$ doped amorphous silicon layer under the data line) that enhances the contact resistance between the aluminum and the conductive adhesive layer. The enhanced contact resistance causes the aluminum to disperse into the conductive adhesive layer under high temperature, forming the irregularity.

Further, when the conductive adhesive layer is etched to form a channel layer, the conductive adhesive layer pattern is exposed outside the source electrode, the drain electrode or the data line. As a result, an undesirable after-image occurs on the liquid crystal display apparatus.

A method of forming a display apparatus without the above problems is desired.

SUMMARY OF THE INVENTION

The present invention provides a thin film transistor for a display apparatus.

The present invention also provides a method suitable for manufacturing the above thin film transistor.

The present invention also provides a display apparatus having the above thin film transistor.

The present invention also provides a method suitable for manufacturing the above display apparatus.

In one aspect of the present invention, a thin film transistor includes a gate electrode on a substrate, a gate insulating layer on the substrate to insulate the gate electrode, a channel pattern, a source electrode and a drain electrode.

The channel pattern includes a semiconductor pattern on the gate electrode such that the semiconductor pattern overlays the gate electrode, a first conductive adhesive pattern on the semiconductor pattern, and a second conductive adhesive pattern formed on the semiconductor pattern and spaced apart from the first conductive adhesive pattern. The source electrode includes a first barrier pattern, a source pattern and a first capping pattern sequentially formed on the first conductive adhesive pattern. The drain electrode includes a second barrier pattern, a drain pattern and a second capping pattern sequentially formed on the second conductive adhesive pattern.

In another aspect of the present invention, a method of manufacturing a thin film transistor is provided as follows. A gate electrode and a gate insulating layer are sequentially formed on a substrate. A semiconductor layer and a conductive adhesive layer are formed on the gate insulating layer such that the semiconductor layer and the conductive adhesive layer overlay the gate electrode. A barrier layer, a conductive thin layer and a capping layer are deposited over the substrate. The capping layer and the conductive thin layer are partially etched to form a first capping pattern, a second capping pattern spaced apart from the first capping pattern, a source pattern and a drain pattern spaced apart from the source pattern on the gate electrode. The barrier layer and the conductive adhesive layer are partially etched to form a first barrier pattern, a second barrier pattern spaced apart from the first barrier pattern, a first conductive adhesive pattern and a second adhesive pattern spaced apart from the first conductive adhesive pattern on the gate electrode.

In still another aspect of the present invention, a display apparatus includes a first display substrate having a thin film transistor and a pixel electrode electrically connected to the drain electrode, a second display substrate and a liquid crystal layer between the first and second substrates.

The thin film transistor includes a gate electrode on a first substrate, a gate insulating layer on the first substrate to insulate the gate electrode, a channel pattern, a source electrode and a drain electrode.

The channel pattern includes a semiconductor pattern on the gate electrode such that the semiconductor pattern overlays the gate electrode, a first conductive adhesive pattern on the semiconductor pattern, and a second conductive adhesive pattern spaced apart from the first conductive adhesive pattern on the semiconductor pattern. The source electrode includes a first barrier pattern, a source pattern and a first capping pattern sequentially formed on the first conductive adhesive pattern. The drain electrode includes a second barrier pattern on the second barrier pattern, a drain pattern and a second capping pattern sequentially formed on the second conductive adhesive pattern.

The second display substrate includes a second substrate facing the first substrate and a common electrode facing the pixel electrode.

In further still another aspect of the present invention, a method of manufacturing a display apparatus is provided as follows. A gate electrode and a gate insulating layer are sequentially formed on a first substrate. A semiconductor layer, a conductive adhesive layer, a barrier layer, a conductive thin layer and a capping layer are sequentially formed on the gate insulating layer. The capping layer and the conductive thin layer are partially etched to form a first capping pattern, a second capping pattern spaced apart from the first capping pattern, a source pattern and a drain pattern spaced apart from the source pattern on the gate electrode. The barrier layer and the conductive adhesive layer are partially etched to form a first barrier pattern, a second barrier pattern spaced apart from the first barrier pattern, a first conductive adhesive pattern and a second conductive adhesive pattern spaced apart from the first conductive pattern on the gate electrode. The pixel electrode is electrically connected to the drain electrode. A common electrode is formed on a second substrate facing the first substrate. A liquid crystal layer is formed between the first and second substrates.

According to the above, the barrier pattern and the conductive adhesive pattern are formed by the dry etching process, so that the display apparatus may prevent the residues of the conductive adhesive pattern around the source and drain electrodes and improve the display quality thereof.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
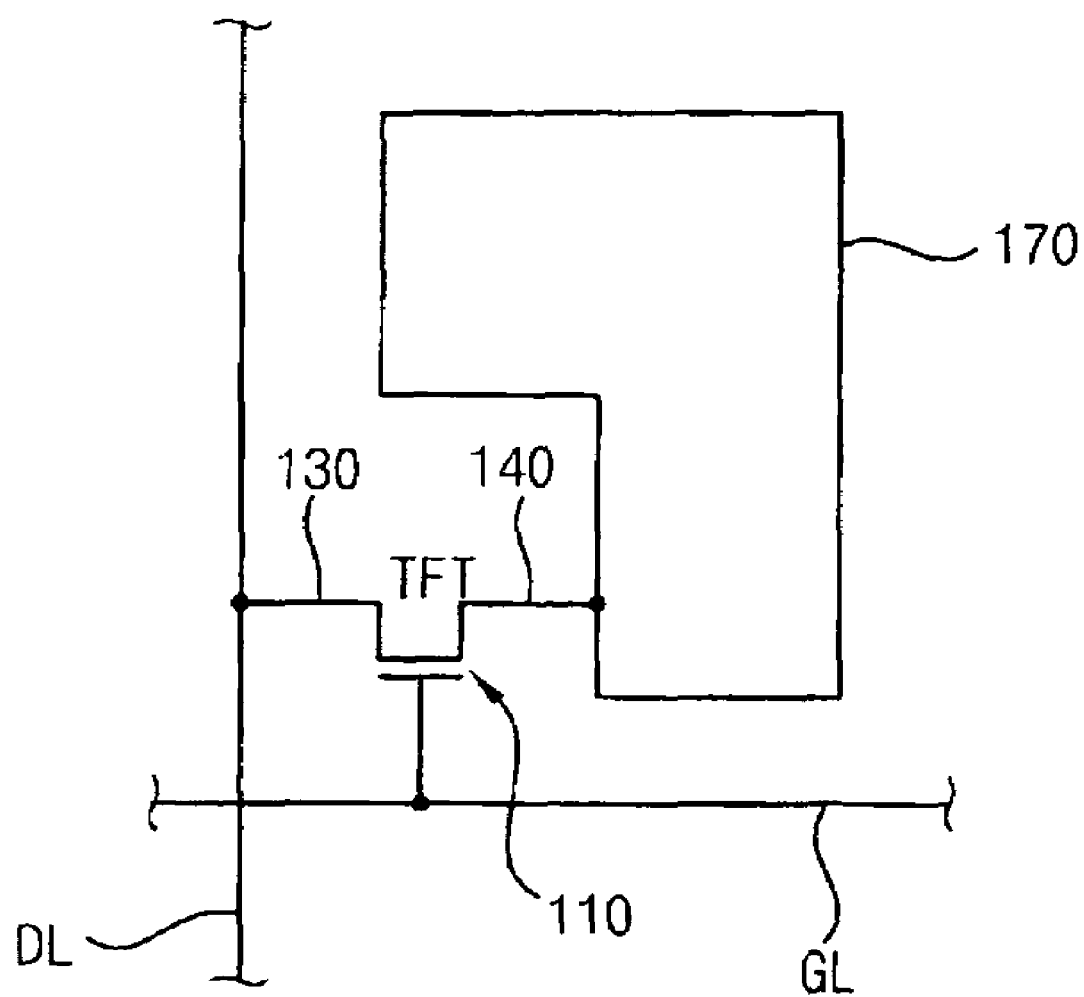
FIG. 1 is a schematic circuit diagram showing a thin film transistor according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be a limitation of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
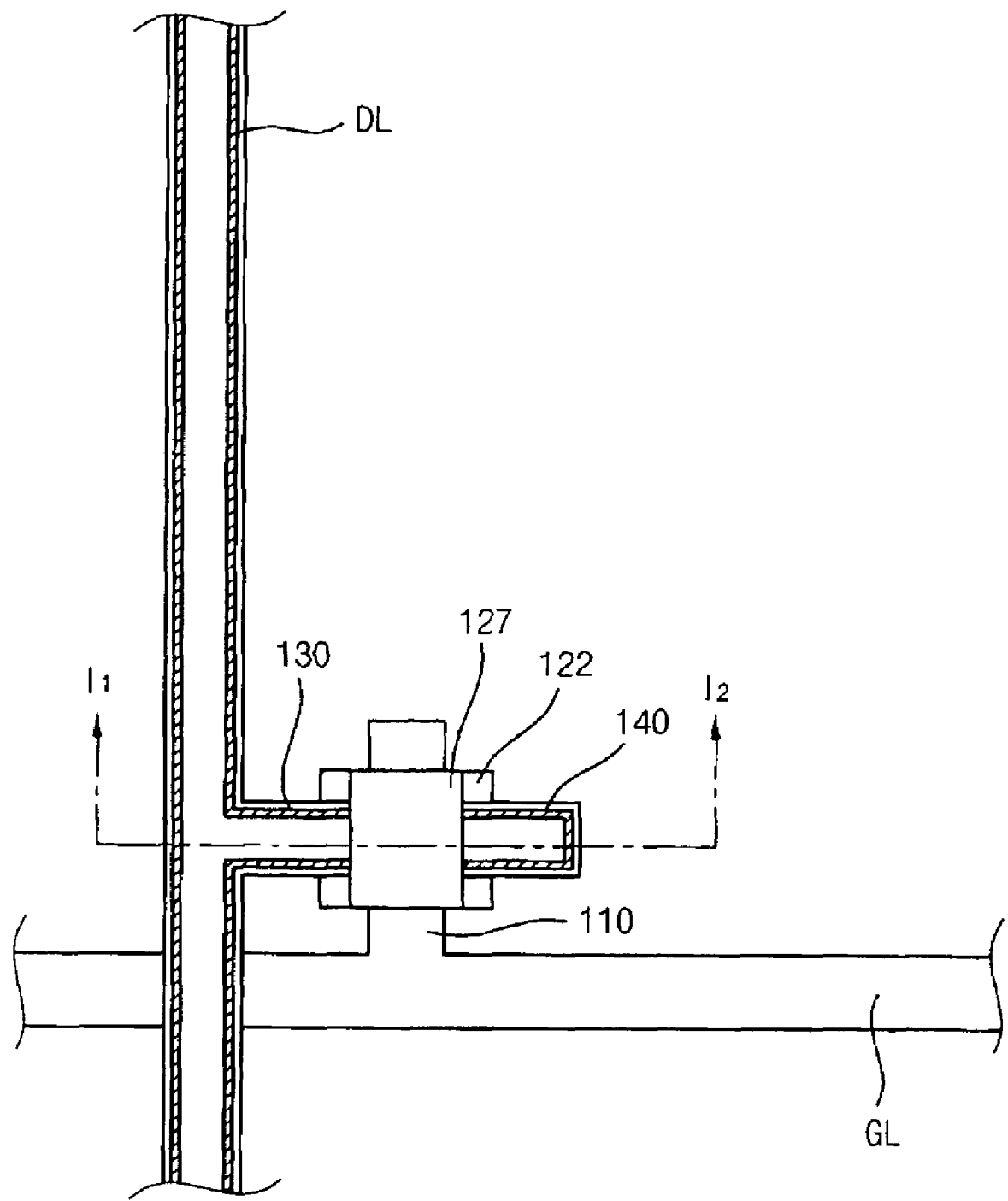
FIG. 2 is a plan view showing the thin film transistor in FIG. 1.
Figure 3:
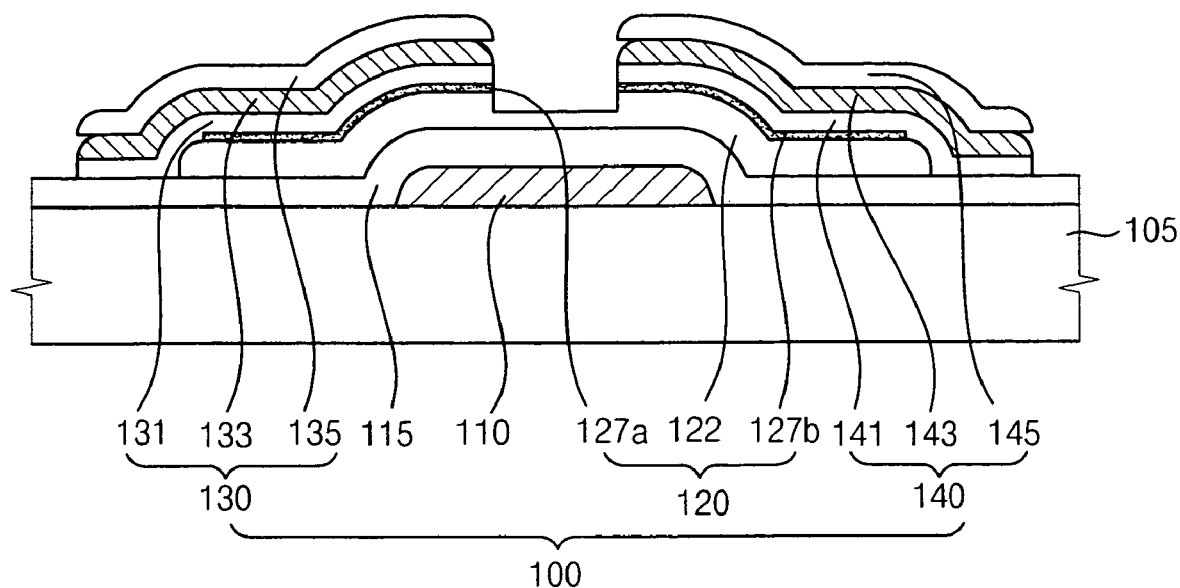
FIG. 3 is a cross-sectional view taken along a line $I_1$-$I_2$ showing the thin film transistor in FIG. 2.

FIG. 1 is a schematic circuit diagram showing a thin film transistor according to an exemplary embodiment of the present invention. FIG. 2 is a plan view of the thin film transistor in FIG. 1. FIG. 3 is a cross-sectional view taken along a line $I_1$-$I_2$ shown in FIG. 2.

Referring to FIG. 1, a thin film transistor TFT includes a gate line GL from which a gate electrode 110 is branched, a data line DL from which a source electrode 130 is branched and a drain electrode 140 spaced apart from the source electrode 130.

The gate line GL has a stripe shape and is formed on a substrate. The gate line GL transmits a gate signal externally provided to the gate electrode 110.

The data line DL is also formed on the substrate. The data line DL is substantially perpendicular to the gate line GL and electrically insulated from the gate line GL. The data line DL transmits a data signal to the source electrode 130.

When a gate voltage that is higher than a threshold voltage of the thin film transistor TFT is applied to the gate electrode 110 through the gate line GL, an electrical characteristic of a channel layer formed inside the thin film transistor TFT is changed from an insulator to a conductor such that the data signal applied to the source electrode 130 is applied to the drain electrode 140 through the channel layer.

Referring to FIGS. 2 and 3, the thin film transistor TFT includes the gate electrode 110, a gate insulating layer 115, a channel pattern 120, the source electrode 130 and the drain electrode 140.

The gate electrode 110 is branched from the gate line GL formed on the substrate. The gate electrode 110 includes a metal material or a metal alloy, such as molybdenum (Mo), aluminum (Al), chromium (Cr), copper (Cu), neodymium (Nd) and so on. In the present embodiment, the gate electrode 110 may be formed as a single-layer or a double-layer structure containing aluminum-neodymium (Al—Nd) and molybdenum (Mo).

When a gate voltage that is higher than the threshold voltage of the thin film transistor TFT is applied to the gate electrode 110 through the gate line GL, a channel is formed at the channel pattern 120 electrically connected to the source electrode 130 and the drain electrode 140. Thus, the data signal applied to the data line DL is transmitted to the drain electrode 140 through the source electrode 130. On the contrary, when the gate voltage that has a lower voltage level than the threshold voltage of the thin film transistor TFT is applied to the gate electrode 110 through the gate line GL, the channel is not formed at the channel pattern 120 electrically connected to the source and drain electrodes 130 and 140. Thus, the data signal applied to the data line DL is not transmitted to the drain electrode 140.

The gate insulating layer 115 is formed on the substrate on which the gate electrode 110 is formed, and electrically insulates the gate electrode 110 from the channel pattern 120. The gate insulating layer 115 may include silicon nitride (SiNx) or silicon oxide (SiOx).

The channel pattern 120 is formed on the gate insulating layer 115 corresponding to the gate electrode 110. The channel pattern 120 may include a semiconductor pattern 122, a first conductive adhesive pattern 127a and a second conductive adhesive pattern 127b.

The semiconductor pattern 122 may include amorphous silicon. When the gate voltage that is applied to the gate electrode 110 is higher than the threshold voltage of the thin film transistor TFT, a channel forms inside the channel pattern 120, thereby electrically connecting the source electrode 130 and the drain electrode 140. The level of the threshold voltage depends upon a width and a length of the channel pattern 120, and the semiconductor pattern 122 has a thickness from about 2000 to about 2500 angstroms.

The semiconductor pattern 122 includes a recess formed thereon. The recess is formed on the semiconductor pattern 122 corresponding to the gate electrode 110. The part of the semiconductor pattern 122 that forms the recess has a thickness of about 500 angstroms. However, in order to prevent damaging the semiconductor pattern 122 due to the recess while the source electrode 130, the drain electrode 140 and the channel pattern 120 are formed by an etching process, the semiconductor pattern 122 is formed to have a total thickness from about 2000 to about 2500 angstroms.

The first and second conductive adhesive patterns 127a and 127b are formed on the semiconductor pattern 122 and spaced apart from each other. The first and second conductive adhesive patterns 127a and 127b include $N^+$ doped amorphous silicon. The first and second adhesive conductive patterns 127a and 127b reduce contact resistance between the semiconductor 122 and the source and drain electrodes 130 and 140. In the present embodiment, the first and second conductive adhesive patterns 127a and 127b have a thickness of about 200 angstroms.

The source electrode 130 includes a first barrier pattern 131, a source pattern 133, and a first capping pattern 135. The drain electrode 140 includes a second barrier pattern 141, a drain pattern 143, and a second capping pattern 145.

The first and second barrier patterns 131 and 141 are formed on the first and second conductive adhesive patterns 127a and 127b, respectively. The first and second barrier patterns 131 and 141 prevent dispersion of a conductive metal of the source and drain patterns 133 and 143, respectively.

The first and second barrier patterns 131 and 141 may be used as an etch-stop layer during the formation of the source and drain patterns 133 and 143 and the first and second capping patterns 135 and 145. The first and second barrier patterns 131 and 141 have an etch selectivity with respect to the source and drain patterns 133 and 143 and the first and second capping patterns 135 and 145. The first and second barrier patterns 131 and 141 include titanium (Ti), tantalum (Ta), tungsten (W), chromium (Cr) and so on.

The source and drain patterns 133 and 143 apply the data signal to the data line DL. In order to prevent signal delay and signal distortion due to elongation of the source and drain patterns 133 and 143, the source and drain patterns 133 and 143 include a metal having low specific resistance, such as aluminum, aluminum alloy, etc. Typically, aluminum has a low specific resistance of about $2.65 \times 10^{-6}$ Ωcm.

The first and second capping patterns 135 and 145 are formed on the source and drain patterns 133 and 143, respectively. The first and second capping patterns 135 and 145 may include molybdenum, molybdenum alloy, etc. Examples of the molybdenum alloy may have molybdenum-niobium (MoNb), molybdenum-tungsten (MoW), molybdenum-copper (MoCu) or the like.

The first and second capping patterns 135 and 145 may prevent the problematic formation of irregularity on the source and drain patterns 133 and 143 caused by heating. Also, the second capping pattern 145 may improve contact characteristic such as the contact resistance between the pixel electrode and the second capping pattern 145.

If the first and second barrier patterns 131 and 141 and the first and second capping patterns 135 and 145 include nitrogen, residual product may be generated due to nitrogen. Thus, in the present embodiment, it is preferred that the first and second barrier patterns 131 and 141 and the first and second capping patterns 135 and 145 do not include nitrogen.

FIGS. 4 to 11 are cross-sectional views illustrating a manufacturing method of the thin film transistor in FIG. 3.

Figure 4:
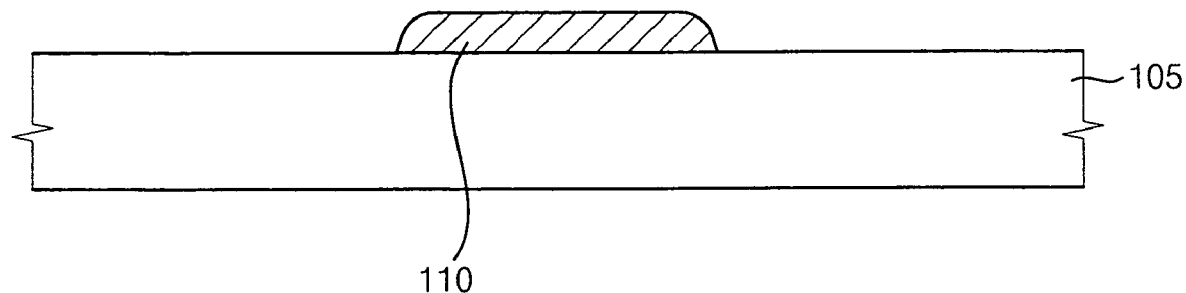
FIGS. 4 to 11 are cross-sectional views illustrating a manufacturing method of the thin film transistor in FIG. 3.

Referring to FIG. 4, a conductive thin film is formed on a first substrate 105. In the present embodiment, examples of the conductive thin film may include molybdenum (Mo), aluminum (Al), chromium (Cr), copper (Cu), neodymium (Nd) and so on. The conductive thin film may be formed as a doubled-layer structure including aluminum-neodymium (Al—Nd) and molybdenum (Mo).

The conductive thin film is partially etched to form the gate electrode 110 on the first substrate 105. The gate electrode 110 is branched from the gate line GL (refer to FIG. 2). In the present embodiment, a storage capacitor line (not shown) may be formed while the gate line GL and the gate electrode 110 are formed. The storage capacitor line is disposed between adjacently positioned gate lines GL and is oriented substantially parallel to the gate lines GL.

Figure 5:
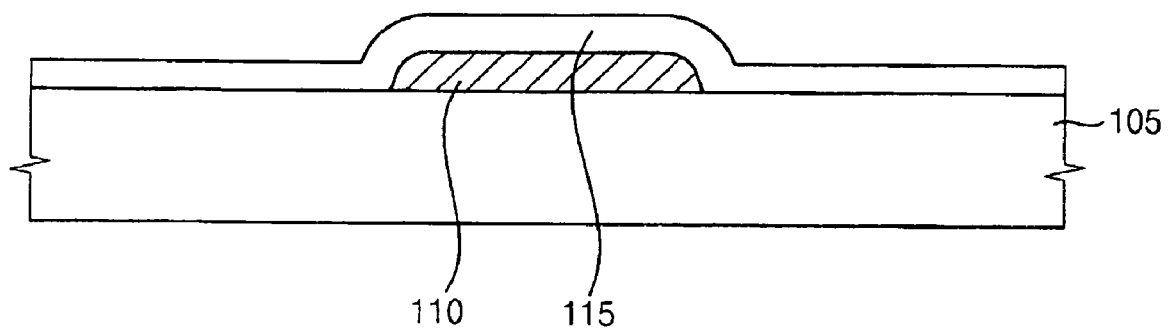

Referring to FIG. 5, the gate insulating layer 115 is formed over the first substrate 105 on which the gate electrode 110 is formed. In the present embodiment, exemplary material for the gate insulating layer 115 includes silicon nitride (SiNx), silicon oxide (SiOx) and so on.

Figure 6:
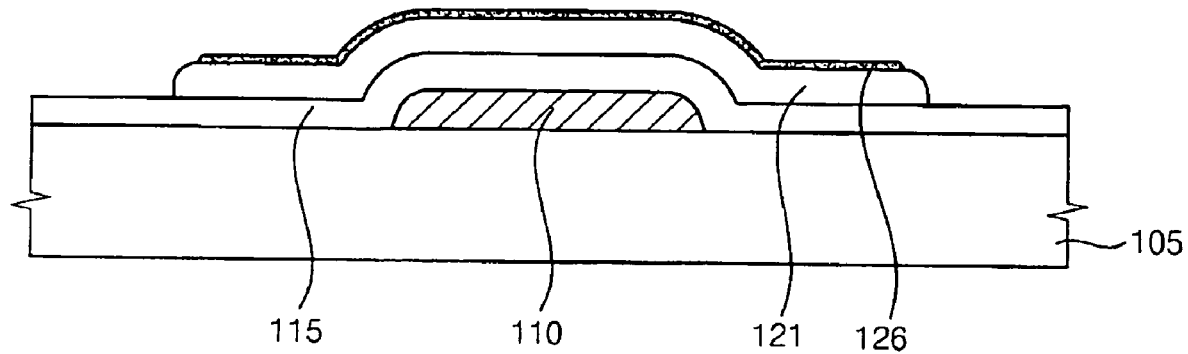

Referring to FIG. 6, an amorphous silicon layer is formed on the gate insulating layer 115. Also, an N+ amorphous silicon layer that is highly doped with N-type impurities is formed on the amorphous silicon layer. The amorphous silicon layer has a thickness from about 2000 to about 2500 angstroms, and the N+ amorphous silicon layer has a thickness of about 500 angstroms.

The amorphous silicon layer and the N+ amorphous silicon layer are partially etched by a photolithographic process, so that a semiconductor pattern 121 is formed on the gate insulating layer 115 and a conductive adhesive layer 126 is formed on the semiconductor pattern 121. The semiconductor pattern 121 overlays the gate electrode 110.

Although not shown in the figures, the amorphous silicon layer and the N+ amorphous silicon layer may be partially etched while the source and drain electrodes are undergoing the photolithographic process to form the semiconductor pattern, and the first and second conductive patterns.

Figure 7:
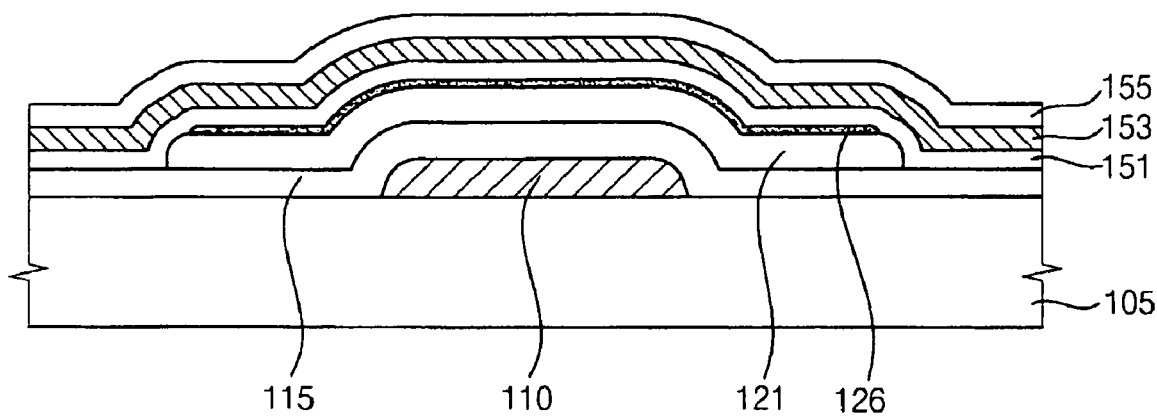

Referring to FIG. 7, a barrier layer 151, a conductive thin layer 153 and a capping layer 155 are sequentially formed on the conductive adhesive layer 126. In the present embodiment, the barrier layer 151, the conductive thin layer 153 and the capping layer 155 are formed by a sputtering process.

The barrier layer 151 has the etch selectivity with respect to the source pattern, the drain pattern, the first capping pattern and the second capping pattern so that the barrier layer 151 acts as an etch stopper that stops the etching of the conductive thin layer 153. In the present embodiment, the barrier layer 151 may include titanium (Ti), tantalum (Ta), tungsten (W), chromium (Cr) and so on.

The conductive thin layer 153 contains a material having a low specific resistance, such as aluminum, aluminum alloy, etc. The specific resistance of aluminum may be as low as about $2.65 \times 10^{-6}$ Ωcm.

The capping layer 155 may include molybdenum, molybdenum alloy, etc. Examples of the molybdenum alloy may have molybdenum-niobium (MoNb), molybdenum-tungsten (MoW), molybdenum-copper (MoCu) or the like.

The capping layer 155 may prevent the irregularity on the source and drain patterns caused by application of heat. Also, the capping layer 155 may improve a contact characteristic such as the contact resistance between the pixel electrode formed thereon and the capping layer 155.

If the capping layer 155 includes the nitrogen, the capping layer 155 is formed by a reactive sputtering process. During the reactive sputtering process, a minus voltage (−) is applied to a cathode after argon (Ar) gas and nitrogen (N) gas are supplied into a vacuum chamber. An electron is emitted in response to the applied voltage. The emitted electron collides with the argon gas atoms to form argon ion (Ar+) and plasma. When the argon ion (Ar+) advances to a target (cathode) and collides with a surface of the target, atoms of the target are stacked on the substrate to form the nitride thin layer. Reactive particles that are generated while the nitride thin layer is formed may cause contamination of the nitride thin layer formed on the substrate. Thus, in the present embodiment, it is preferable that the capping layer 155 does not include nitrogen.

Although not shown in the figures, the gate insulating layer, the amorphous silicon layer, the N+ amorphous silicon layer, the barrier layer, the conductive thin layer and the capping layer may be sequentially formed on the first substrate, in addition to the gate electrode.

Figure 8:
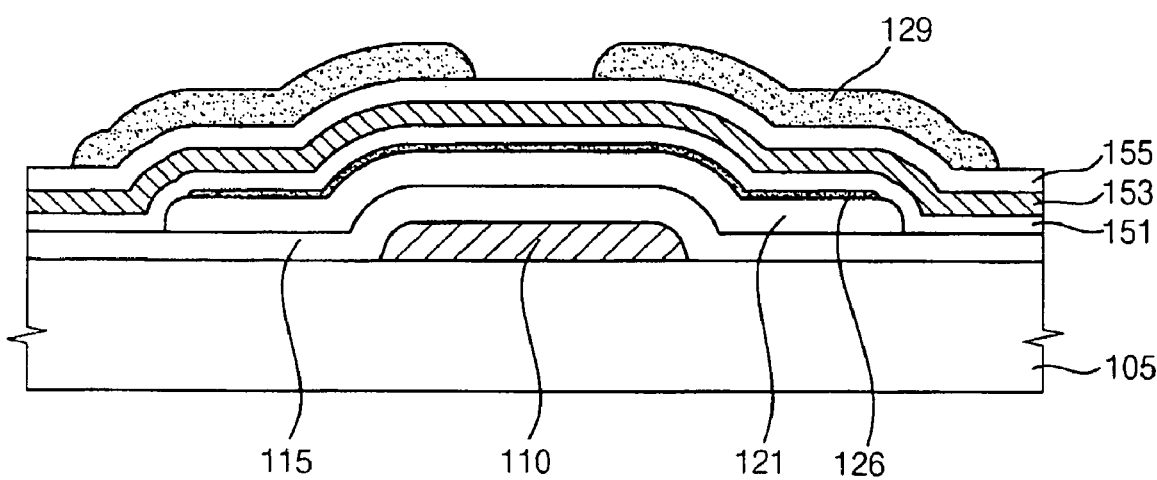

Referring to FIG. 8, a photoresist (not shown) is coated on the substrate 105 on which the capping layer 155 is formed. The photoresist is exposed and developed using a mask to form a photoresist pattern 129 corresponding to the source and drain electrodes.

Figure 9:
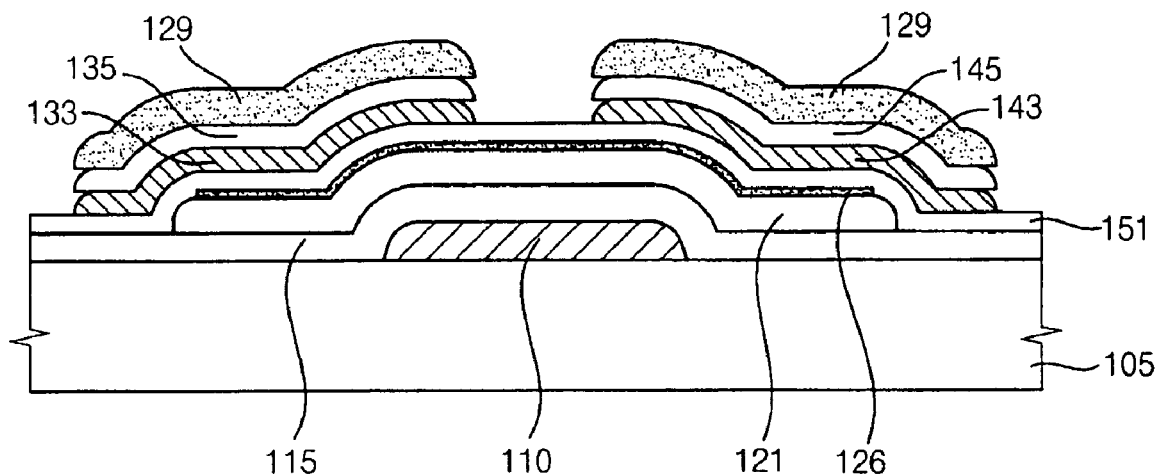

Referring to FIG. 9, the capping layer 155 and the conductive thin layer 153 are partially etched with the photoresist pattern 129 as an etching mask, so that the first and second capping patterns 135 and 145, and the source and drain patterns 133 and 143 are formed. The first and second capping patterns 135 and 145 and the source and drain patterns 133 and 143 are formed by a wet etching process. The first and second capping patterns 135 and 145 and the source and drain patterns 133 and 143 may be formed using different processes or in a single process.

In the wet etching process for the first and second capping patterns 135 and 145 and source and drain patterns 135 and 145, the etchant for the wet etching process may include phosphoric acid ($H_2PO_4$), acetic acid ($CH_3COOH$), nitric acid ($HNO_3$) or a mixture thereof. Since the barrier layer 151 under the conductive thin layer has the etch selectivity with respect to the conductive thin layer, the barrier layer 151 is not etched during the wet etching process.

Figure 10:
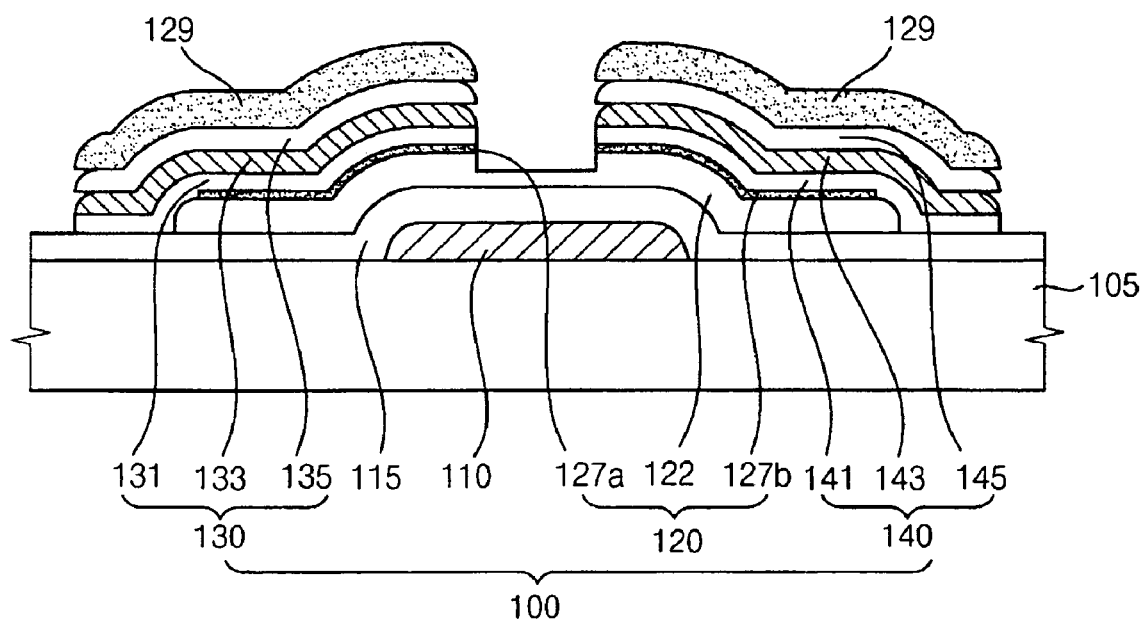

Referring to FIG. 10, the barrier layer 151 and the conductive adhesive layer (not shown) are partially etched using the photoresist pattern 129 as the mask to form the first barrier pattern 131, the second barrier pattern 141, the first conductive adhesive pattern 127a and the second conductive adhesive pattern 127b. The first barrier pattern 131, the second barrier pattern 141, the first conductive adhesive pattern 127a and the second conductive adhesive pattern 127b may be formed by a dry etching process. The etched portions of the first and second conductive adhesive patterns 127a and 127b may have a substantially vertical profile such that they are not exposed outside the source and drain patterns 133 and 143, thereby improving the characteristics of the thin film transistor. In other words, a sidewall defined by the first barrier pattern 131, the first conductive adhesive pattern 127a and the semiconductor pattern 122 forms a right angle with respect to the 105, and a sidewall defined by the second barrier pattern 141, the second conductive adhesive pattern 127b and the semiconductor pattern 122 forms a right angle with respect to the 105. The number of process steps needed to form the thin film transistor may be reduced since the barrier layer 151 and the conductive adhesive layer are substantially simultaneously etched by the dry etching process.

An etching gas for the dry etching process may include chlorine (Cl), fluorine (F) and so on.

The etching gas includes a chlorine-containing compound, examples of which include chlorine ($Cl_2$), hydrogen chloride (HCl) and barium chloride ($BCl_3$). If the etching gas includes a chlorine-containing compound and the barrier layer 151 contains titanium, the chemical reaction for etching the barrier layer 151 is represented by chemical equation (1) shown below. Alternatively, the etching gas may include a fluorine-containing compound, examples of which include sulfur hexafluoride ($SF_6$) and carbon tetrafluoride ($CF_4$). If the etching gas includes a fluorine-containing compound and the barrier layer 151 contains titanium, the chemical reaction for etching the barrier layer 151 is represented by chemical equation (2) shown below.

$$Ti + 4Cl^- \rightarrow TiCl_4 \quad (1)$$

$$Ti + 4F^- \rightarrow TiF_4 \quad (2)$$

During the dry etching process, the photoresist pattern 129 or the oxygen gas ($O_2$) adsorbed on a wall of a process chamber reacts with the barrier layer 151 to form a metal oxide, which deteriorates the etching ratio of the substrate. The etching gas including the fluorine-containing compound may easily remove the metal oxide. When the etching gas includes the barium chloride ($BCl_3$) with the fluorine (F), the metal oxide such as titanium oxide ($TiO_2$) may be easily removed as represented by chemical equation (3):

$$3TiO_2 + 2BCl_3 \rightarrow 3TiCl_2 + 2B_2O_3 \qquad (3)$$

The semiconductor pattern 122 including the amorphous silicon is overetched while the first and second barrier patterns 131 and 141 and the first and second conductor adhesive patterns 127a and 127b are etched, thereby forming the recess. The thickness of the semiconductor pattern 122 may be adjusted to control the threshold voltage of the thin film transistor.

Although not shown in the figures, the amorphous silicon layer and the $N^+$ amorphous silicon layer are partially etched during the photolithographic process for the source and drain electrodes. As a result, the semiconductor pattern 122 having the recess is formed as well as the first and second conductive adhesive patterns 127a and 127b.

Figure 11:
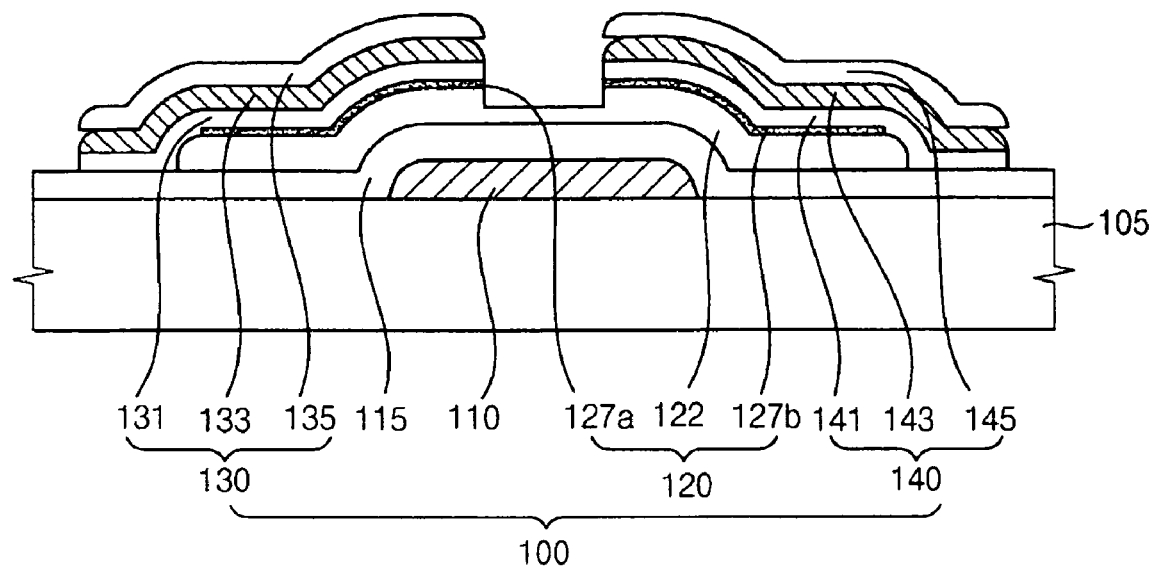

Referring to FIG. 11, stripping the photoresist pattern 129 completes the formation of the thin film transistor having the gate electrode 110, the gate insulating layer 115, the channel pattern 120, the source electrode 130 and the drain electrode 140. As shown in FIG. 11, end portions of the first capping pattern, the second capping pattern, the source pattern and the drain pattern have an inclined cross-sectional profile.

Figure 12:
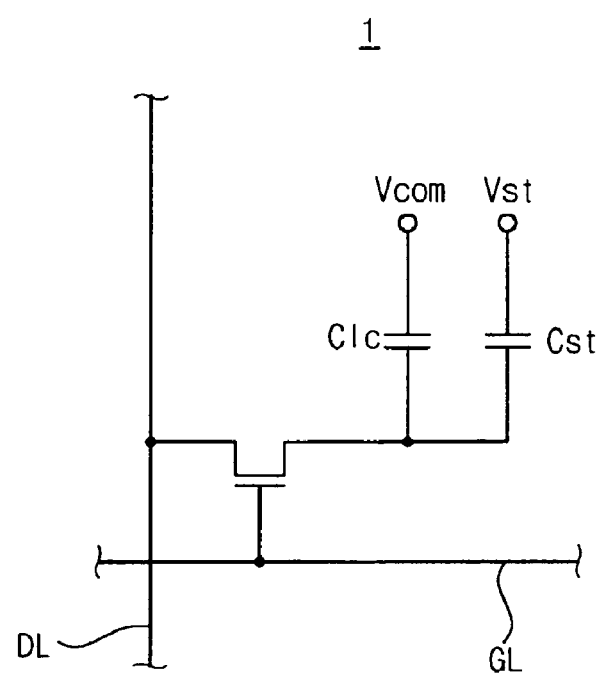
FIG. 12 is an equivalent circuit diagram showing a display apparatus according to an exemplary embodiment of the present invention.
Figure 13:
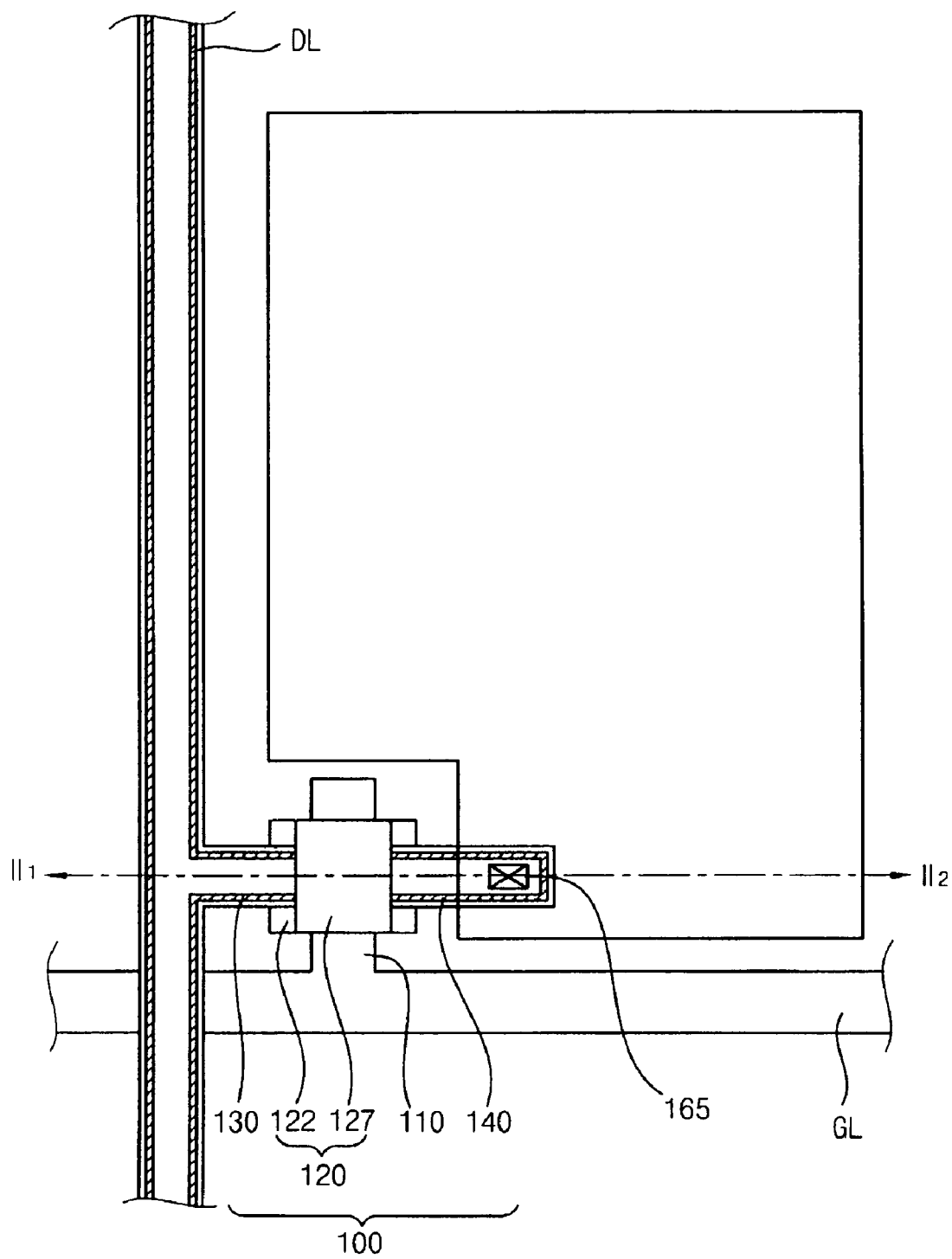
FIG. 13 is a plan view showing the display apparatus having the thin film transistor in FIG. 3.
Figure 14:
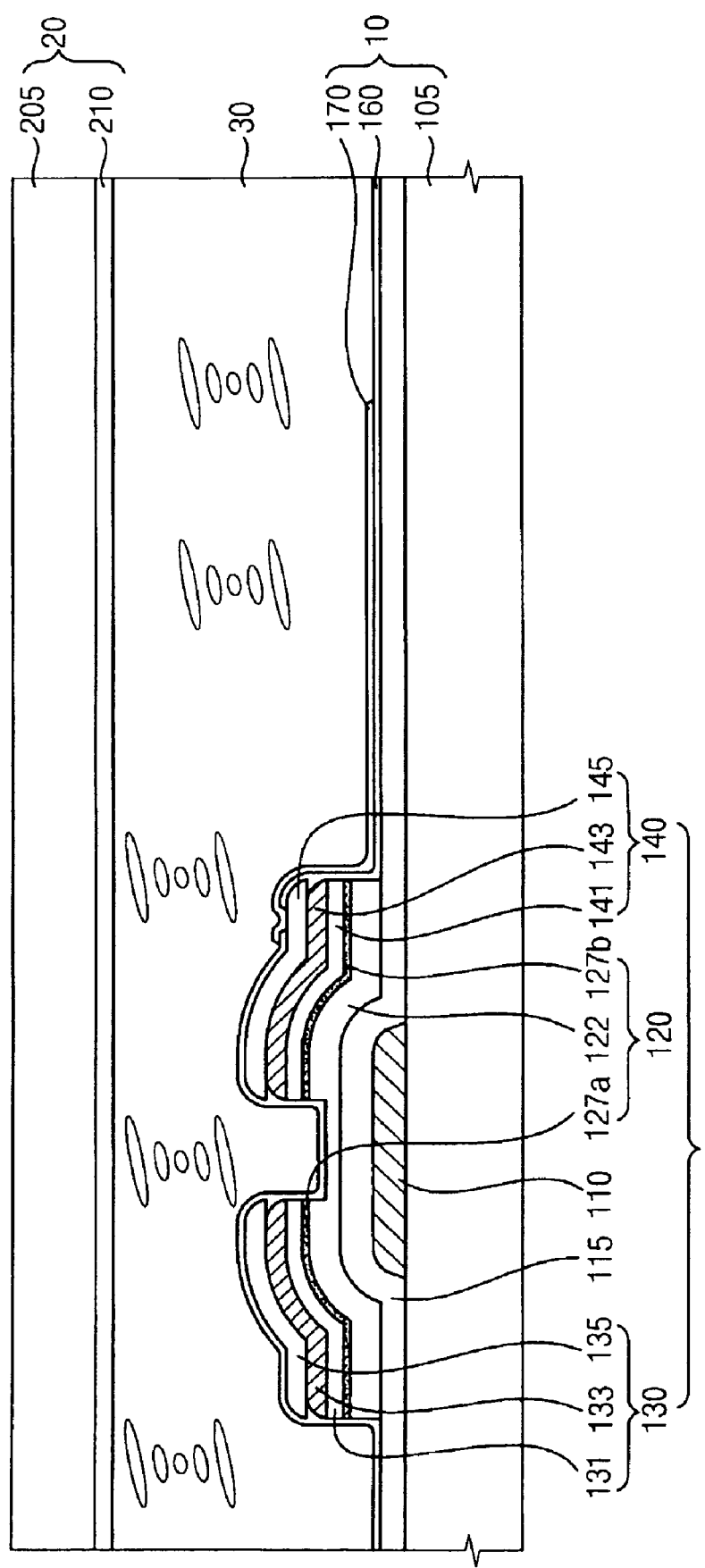
FIG. 14 is a cross-sectional view taken along a line $II_1$-$II_2$ showing the display apparatus in FIG. 13.

FIG. 12 is a circuit diagram showing a display apparatus according to another exemplary embodiment of the present invention. FIG. 13 is a plan view showing the display apparatus having the thin film transistor of FIG. 3. FIG. 14 is a cross-sectional view taken along a line $II_1$-$II_2$ shown in FIG. 13.

Referring to FIGS. 12 to 14, the display apparatus includes a first display substrate, a second display substrate and a liquid crystal layer. In FIGS. 12 to 14, the same reference numerals denote the same elements as in FIGS. 1 to 11. Thus, any further repetitive descriptions of the same elements will be omitted.

The first display substrate 10 includes a first substrate 105, a thin film transistor 100 and a pixel electrode 170.

The first substrate 105 is a transparent glass that transmits light. In the present embodiment, the transparent glass for the first substrate 105 does not include an alkali ion. When the transparent glass includes the alkali ion, the alkali ion is eluted from the glass into the liquid crystal layer 30, undesirably changing the resistance of the liquid crystal layer and the adhesive force between a sealant (not shown) and the glass.

The thin film transistor 100 includes the gate electrode 110, the gate insulating layer 115, the channel pattern 120, the source electrode 130 and the drain electrode 140.

As shown in FIG. 13, the gate electrode 110 is branched from the gate line GL on the first substrate 105. The gate line GL receives the control signal that drives the thin film transistor 100 and transmits the control signal to the gate electrode 110. Exemplary materials for the gate electrode 110 may include molybdenum (Mo), aluminum (Al), chromium (Cr), copper (Cu) and an alloy thereof. The gate electrode 110 may be formed as a single-layer or a double-layer structure having a conductive metal.

The gate insulating layer 115 is formed over the first substrate 105 on which the gate line GL and the gate electrode 110 are formed. The gate insulating layer 115 electrically insulates the gate line GL from the gate electrode 110. The gate insulating layer 115 may include silicon nitride (SiNx) or silicon oxide (SiOx).

The channel pattern 120 includes the semiconductor pattern 122, and the first and second conductive adhesive patterns 127a and 127b. Exemplary semiconductor pattern 122 may include amorphous silicon, and examples of the first and second conductive adhesive patterns 127a and 127b may include the $N^+$ amorphous silicon.

The recess is formed on the semiconductor pattern 122 corresponding to the gate electrode 110. The semiconductor pattern 122 that forms part of the recess has the thickness of about 500 angstroms. However, in order to prevent damaging the semiconductor pattern 122 while the source electrode 130, the drain electrode 140 and the channel pattern 120 are formed by the etching process, the semiconductor pattern 122 has a total thickness from about 2000 to about 2500 angstroms.

The source electrode 130 includes the first barrier pattern 131, the source pattern 133 and the first capping pattern 135. The drain electrode 140 includes the second barrier pattern 141, the drain pattern 143 and the second capping pattern 145.

The first and second barrier patterns 131 and 141 are formed on the first and second conductive adhesive patterns 127a and 127b, respectively. The first and second barrier patterns 131 and 141 prevent dispersion of the conductive metal of the source and drain patterns 133 and 143, respectively.

The first and second barrier patterns 131 and 141 may be used as the etch-stop layer when the source and drain patterns 133 and 143 and the first and second capping patterns 135 and 145 are formed. The first and second barrier patterns 131 and 141 have the etch selectivity with respect to the source and drain patterns 133 and 143 and the first and second capping patterns 135 and 145. Examples of the first and second barrier patterns 131 and 141 include titanium (Ti), tantalum (Ta), tungsten (W), chromium (Cr) and so on.

The source and drain patterns 133 and 143 apply the data signal to the data line DL. In order to prevent signal delay and signal distortion due to elongation of the source and drain patterns 133 and 143, the source and drain patterns 133 and 143 include a metal having low specific resistance, for example, such as the aluminum, the aluminum alloy, etc. An example of the aluminum has the low specific resistance of about $2.65 \times 10^{-6}$ Ωcm.

The first and second capping patterns 135 and 145 are formed on the source and drain patterns 133 and 143, respectively. The first and second capping patterns 135 and 145 may include molybdenum, molybdenum alloy, etc. Examples of the molybdenum alloy may include molybdenum-niobium (MoNb), molybdenum-tungsten (MoW), molybdenum-copper (MoCu) or the like.

The first and second capping patterns 135 and 145 may prevent the formation of irregularity on the source and drain pattern 133 and 143 caused by heat. Also, the second capping pattern 145 may improve contact characteristic such as the contact resistance between the pixel electrode and the second capping pattern 145.

If the first and second barrier patterns 131 and 141 and the first and second capping patterns 135 and 145 include nitrogen, residual product due to nitrogen may be generated. Thus, in the present embodiment, the first and second barrier patterns 131 and 141, and the first and second capping patterns 135 and 145 preferably do not include nitrogen.

The first display substrate 10 may further include a passivation layer 160 on the first substrate 105 on which the source and drain electrodes 130 and 140 are formed. The passivation layer 160 includes silicon nitride to protect the thin film transistor.

The pixel electrode 170 is electrically connected to the drain electrode 140. The pixel electrode 170 may include indium tin oxide (ITO), indium zinc oxide (IZO) or the like. The pixel electrode 170 is formed by partially etching a transparent conductive layer.

The second display substrate 20 includes a second substrate 205 and a common electrode 210.

The second substrate 205 includes a transparent glass. The second substrate 205 has substantially same optical properties as the first substrate 105.

The common electrode 210 is formed over the second substrate 205. Examples of the common electrode 210 include a transparent conductive material, for example, such as indium tin oxide (ITO), indium zinc oxide (IZO), tin oxide (TO), zinc oxide (ZO) or the like. The common electrode 210 may be formed on the first display substrate 10 such that the common electrode 210 is in substantially parallel with the pixel electrode 170.

The second substrate 20 may further include a color filter layer (not shown) and a light blocking member (not shown).

The color filter layer may be formed on the second substrate 20 corresponding to the pixels. The color filter layer selectively transmits the light having a predetermined wavelength. The color filter layer includes a red color filter portion, a green color filter portion and a blue color filter portion. The color filter layer includes one or more of a photopolymerization initiator, a monomer, a binder, a pigment, a dispersing agent, a solvent, a photoresist, etc. Thus, the color filter layer may be formed on the first substrate 10.

The light blocking member blocks the light passing through a non-effective display area so as to prevent light leakage and improve the display quality of the apparatus.

The first display substrate 10 and the second display substrate 20 are spaced apart from each other by a spacer (not shown) disposed therebetween. The spacer may include a column spacer, a ball spacer, or a combination thereof.

The first display substrate 10 and the second display substrate 20 include alignment layers (not shown) formed thereon, respectively.

When the liquid crystal layer 30 is disposed between the first and second display substrates 10 and 20 and sealed by the sealant, the display apparatus having the first display substrate 10, the second display substrate 20 and the liquid crystal layer 30 is completed.

FIGS. 15 to 24 are cross-sectional views illustrating a manufacturing method of the display apparatus shown in FIG. 14.

Figure 15:
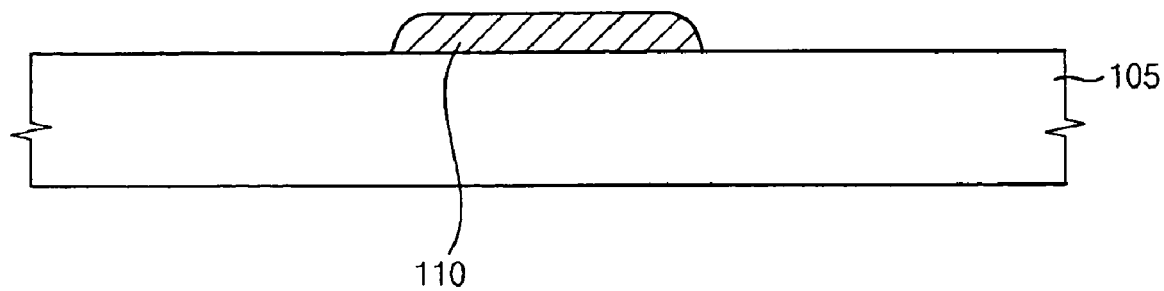
FIGS. 15 to 24 are cross-sectional views illustrating a manufacturing method of the display apparatus shown in FIG. 14.

Referring to FIG. 15, a conductive thin film is formed on the first substrate 105. In the present embodiment, an exemplary conductive thin film may include molybdenum (Mo), aluminum (Al), chromium (Cr), copper (Cu), neodymium (Nd) or an alloy thereof. Also, the conductive thin film may be formed as a doubled-layer structure including aluminum-neodymium (Al—Nd) and molybdenum (Mo).

The conductive thin film is partially etched to form the gate electrode 110 on the first substrate 105. The gate electrode 110 is branched from the gate line GL (not shown).

Figure 16:
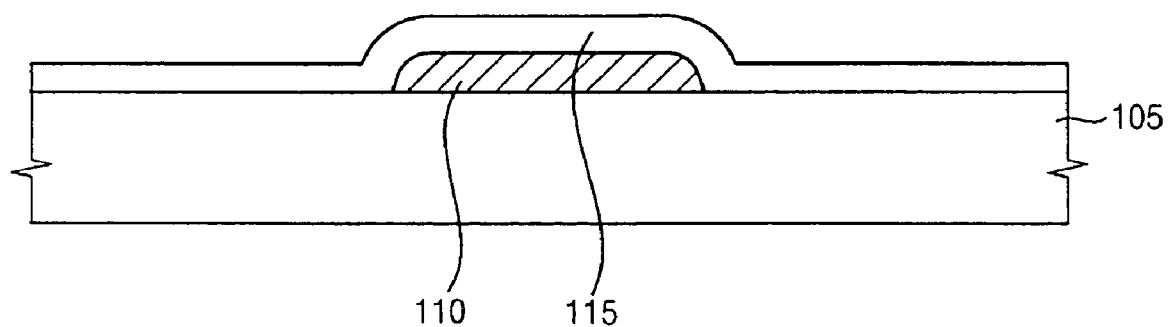

Referring to FIG. 16, the gate insulating layer 115 is formed over the first substrate 105 on which the gate electrode 110 is formed. In the present embodiment, examples of materials for the gate insulating layer 115 include silicon nitride (SiNx), silicon oxide (SiOx) and so on.

Figure 17:
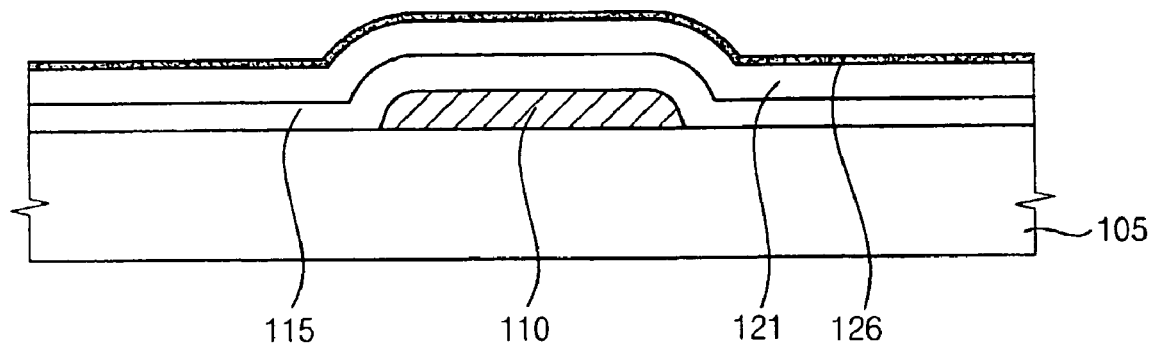

Referring to FIG. 17, an amorphous silicon layer 121 is formed on the gate insulating layer 115. Also, an $N^+$ amorphous silicon layer 126 is formed on the amorphous silicon layer 121. The amorphous silicon layer 121 has a thickness from about 2000 to about 2500 angstroms, and the $N^+$ amorphous silicon layer 126 has a thickness of about 500 angstroms.

Figure 18:
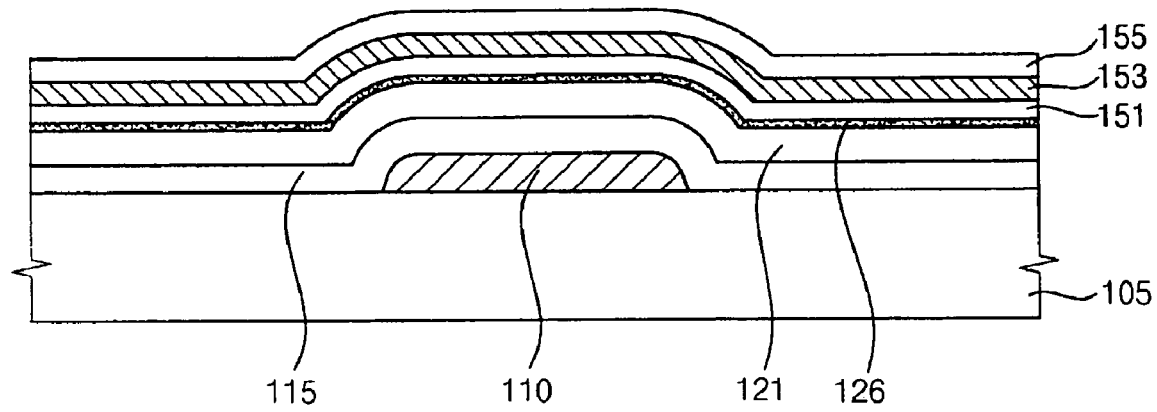

Referring to FIG. 18, a barrier layer 151, a conductive thin layer 153 and a capping layer 155 are sequentially formed on the amorphous silicon layer 126. In the present embodiment, the barrier layer 151, the conductive thin layer 153 and the capping layer 155 are formed by the sputtering process.

The barrier layer 151 has the etching selectivity with respect to the conductive thin layer 153 and the capping layer 155 and thus acts as an etch stopper so as to stop the etching of the conductive adhesive layer 126. In the present embodiment, the barrier layer 151 may include titanium (Ti), tantalum (Ta), tungsten (W), chromium (Cr) and so on.

The conductive thin layer 153 has a low specific resistance. For example, the conductive thin layer 153 may contain materials such as the aluminum, the aluminum alloy, etc. The specific resistance of aluminum may be as low as about $2.65 \times 10^{-6}$ $\Omega$cm.

The capping layer 155 may include molybdenum, molybdenum alloy, etc. Examples of the molybdenum alloy may have molybdenum-niobium (MoNb), molybdenum-tungsten (MoW), molybdenum-copper (MoCu) or the like.

The capping layer 155 may prevent the irregularity on the source and drain patterns caused by the heat. Also, the capping layer 155 may improve a contact characteristic such as the contact resistance between the pixel electrode formed thereon and the capping layer 155.

In case that the capping layer 155 includes nitrogen, the capping layer 155 is formed by the reactive sputtering process, which is described above. As previously mentioned, it is preferable that the capping layer 155 does not include nitrogen.

Figure 19:
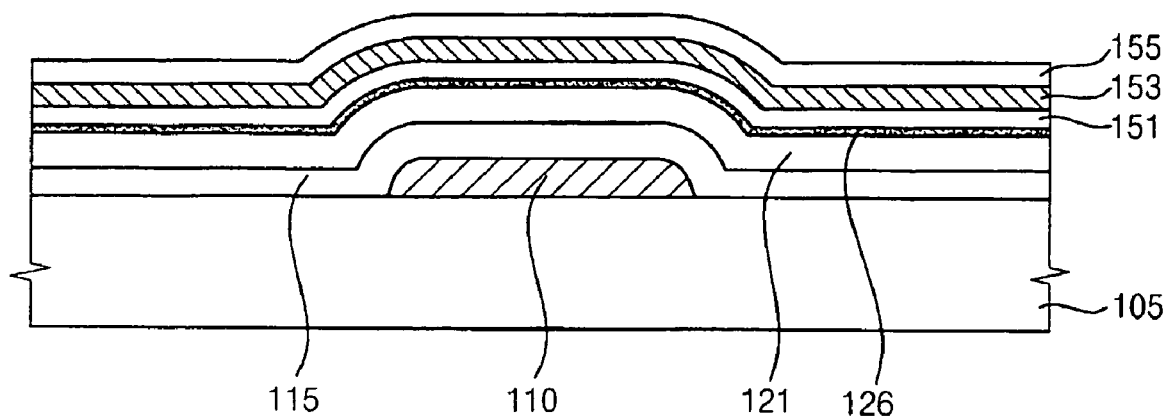

Referring to FIG. 19, a photoresist (not shown) is coated on the substrate 105 on which the capping layer 155 is formed. The photoresist is exposed and developed using a mask to form a photoresist pattern 129 corresponding to the source and drain electrodes.

Figure 20:
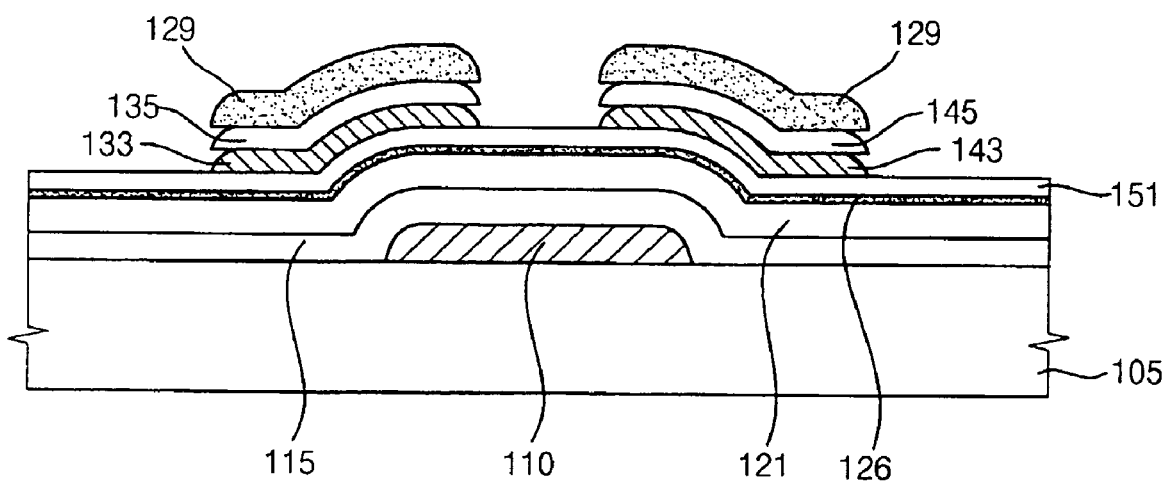

Referring to FIG. 20, the capping layer 155 and the conductive thin layer 153 are partially etched with the photoresist pattern 129 as an etching mask, so that the first and second capping patterns 135 and 145, and the source and drain patterns 133 and 143 are formed. The first and second capping patterns 135 and 145 and the source and drain patterns 133 and 143 are formed by a wet etching process. The first and second capping patterns 135 and 145 and the source and drain patterns 133 and 143 may be formed in different processes or in a single process.

In the wet etching process for the first and second capping patterns 135 and 145 and source and drain patterns 135 and 145, an etchant for the wet etching process may include phosphoric acid ($H_2PO_4$), acetic acid ($CH_3COOH$), nitric acid ($HNO_3$) or a combination thereof. Since the barrier layer 151 under the conductive thin layer has the etch selectivity with respect to the conductive thin layer, the barrier layer 151 is not etched during the wet etching process.

Figure 21:
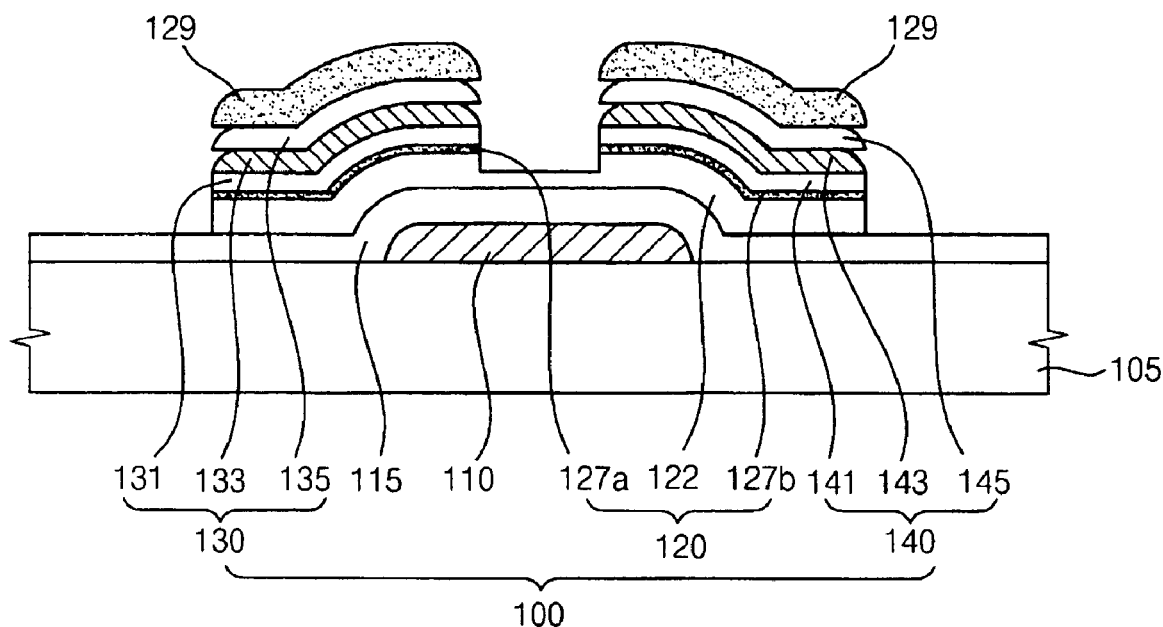

Referring to FIG. 21, the barrier layer 151, the conductive adhesive layer 126 and the amorphous silicon layer 121 are partially etched using the photoresist pattern 129 as the mask to form the first barrier pattern 131, the second barrier pattern 141, the first conductive adhesive pattern 127a, the second conductive adhesive pattern 127b and the semiconductor pattern 122. The first and second conductive adhesive patterns 127a and 127b and the semiconductor pattern 122 define the channel pattern 120.

The first barrier pattern 131, the second barrier pattern 141, the first conductive adhesive pattern 127a, the second conductive adhesive pattern 127b and the semiconductor pattern 122 may be formed by a dry etch process. Thus, the etched portions of the first and second conductive adhesive patterns 127a and 127b may have a substantially vertical profile and prevent the accumulation of residue of the first and second conductive adhesive patterns 127a and 127b and the semiconductor pattern 122, thereby improving the characteristics of the thin film transistor.

Further, the number of process steps for the thin film transistor may be reduced since the barrier layer 151 and the conductive adhesive layer (not shown) are etched substantially simultaneously by the dry etching process.

An etching gas for the dry etching process may include chlorine (Cl), Fluorine (F) and so on.

The etching gas includes a chlorine-containing compound, examples of which include chlorine ($Cl_2$), hydrogen chloride (HCl) and barium chloride ($BCl_3$). In case that the etching gas includes the chlorine-containing compound and the barrier layer 151 contains titanium, a chemical reaction for etching the barrier layer 151 is represented by chemical equation (1) shown above. Alternatively, if the etching gas includes a fluorine-containing compound such as sulfur hexafluoride ($SF_6$) or carbon tetrafluoride ($CF_4$) and the barrier layer 151 contains titanium, the chemical reaction for etching the barrier layer 151 is represented by the chemical equation (2) shown above.

During the dry etching process, the photoresist pattern 129 or oxygen gas ($O_2$) adsorbed on a wall of a process chamber is reacted with the barrier layer 151 to form a metal oxide, changing the etching ratio of the substrate. The etching gas including the fluorine-containing compound may easily remove the metal oxide. When the etching gas includes the barium chloride ($BCl_3$) with the fluorine (F), the metal oxide such as titanium oxide ($TiO_2$) may be easily removed as represented by the chemical equation (3) shown above.

The semiconductor pattern 122 including the amorphous silicon may be overetched while the first and second barrier patterns 131 and 141 and the first and second conductor adhesive patterns 127a and 127b are etched, to thereby form the recess. Thus, a thickness of the semiconductor pattern 122 may be adjusted, so that the threshold voltage of the thin film transistor may be controlled.

Figure 22:
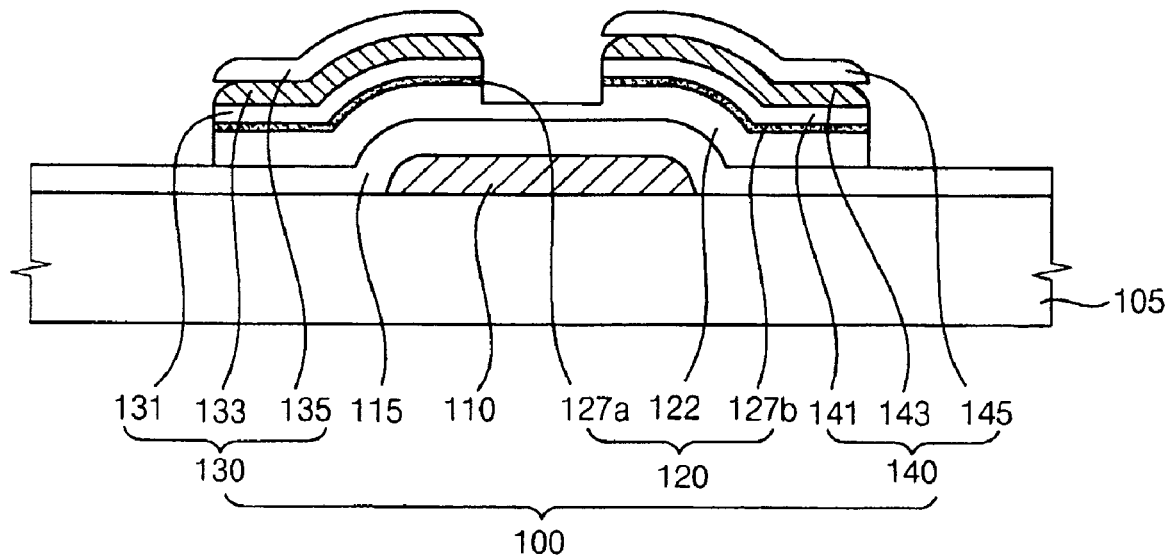

Referring to FIG. 22, the photoresist pattern 129 is stripped. After the stripping is done, formation of the thin film transistor having the gate electrode 110, the gate insulating layer 115, the channel pattern 120, the source electrode 130 and the drain electrode 140 is completed.

Figure 23:
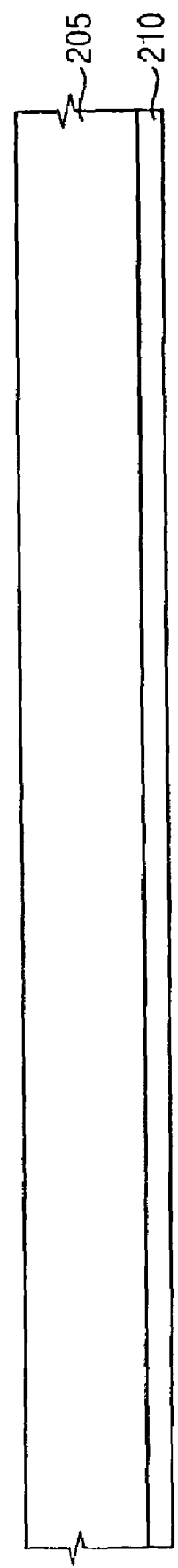

Referring to FIG. 23, a transparent conductive material is formed on the second substrate 205 to form the common electrode 210.

The light blocking member (not shown) and the color filter layer may be formed on the second substrate 205 before forming the common electrode 210. In order to form the light blocking member and the color filter layer, an opaque material and the photoresist are sequentially deposited on the second substrate 205. The opaque material is partially removed by the photolithography process to form the light blocking member. The light blocking member may be formed on the first display substrate. The color filter layer is formed on the second substrate on which the light blocking member is formed. Also, an overcoating layer may be formed on the second substrate on which the light blocking member and the color filter layer are formed.

Thus, the second display substrate 20 having the common electrode 210 is formed.

Figure 24:
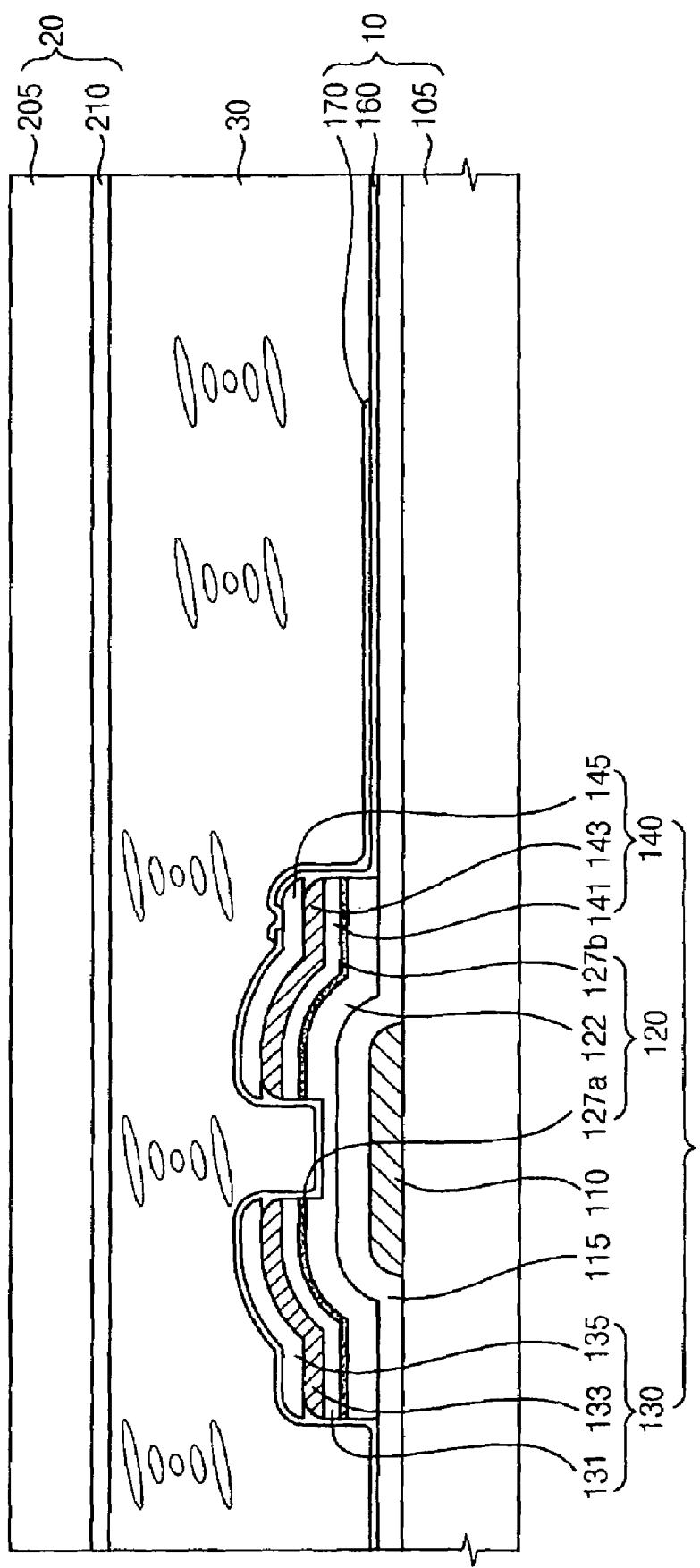

Referring to FIG. 24, the first and second display substrates 10 and 20 are sealed by the sealant after injection of the liquid crystal between the first and second display substrates 10 and 20, so that the liquid crystal layer 30 is formed between the first and second display substrates 10 and 20. Alternatively, the first and second display substrates 10 and 20 are coupled to each other after the liquid crystal is dropped onto the first display substrate 10 or the second display substrate on which the sealant is formed, thereby forming the liquid crystal layer 30 between the first and second display substrates 10 and 20.

A liquid crystal display panel having the first display substrate 10, the second display substrate 20 and the liquid crystal layer 30 is formed as described above.

The data line and the source electrode include a low resistance metal, to improve the display quality of the display apparatus. Also, since the capping layer and the barrier layer are formed on and under the low resistance metal, respectively, formation of irregularity on the low resistance metal and the dispersion of atoms of the low resistance metal are prevented.

Further, since the barrier pattern and the conductive adhesive pattern are formed by the dry etching process, accumulation of residues of the conductive adhesive pattern around the source and drain electrodes is prevented, improving the display quality of the apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a thin film transistor, the method comprising:
   forming a gate electrode on a substrate;
   forming a gate insulating layer on the substrate;
   forming a semiconductor layer and a conductive adhesive layer on the gate insulating layer such that the semiconductor layer and the conductive adhesive layer overlay the gate electrode;
   depositing a barrier layer, a conductive thin layer and a capping layer over the substrate;
   partially etching the capping layer and the conductive thin layer to form a first capping pattern, a second capping pattern spaced apart from the first capping pattern, a source pattern and a drain pattern spaced apart from the source pattern on the gate electrode; and
   partially etching the baffler layer and the conductive adhesive layer to form a first barrier pattern, a second barrier pattern spaced apart from the first barrier pattern, a first conductive adhesive pattern and a second adhesive pattern spaced apart from the first conductive adhesive pattern on the gate electrode.

2. The method of claim 1, wherein the first and second barrier patterns comprise a metal selected from the group consisting of titanium, tantalum, tungsten and chromium.

3. The method of claim 1, wherein the source and drain patterns comprise a metal selected from the group consisting of aluminum and an aluminum alloy.

4. The method of claim 1, wherein the first and second capping patterns comprise a metal selected from the group consisting of molybdenum and a molybdenum alloy.

5. The method of claim 4, wherein the molybdenum alloy comprises molybdenum-niobium.

6. The method of claim 1, wherein the forming of the first and second barrier patterns and the first and second conductive adhesive patterns further comprises forming a recess at the semiconductor pattern corresponding to the gate electrode.

7. The method of claim 4, wherein the first and second conductive adhesive patterns are disposed on two sides of the recess, respectively.

8. The method of claim 1, wherein the first and second capping patterns and the source and drain patterns are formed by:
    partially etching the capping layer to form the first and second capping patterns; and
    partially etching the conductive thin layer to form the source and drain patterns.

9. The method of claim 1, wherein the first and second capping patterns, and the source and drain patterns are formed by a wet etching process.

10. The method of claim 9, wherein the first and second capping patterns, and the source and drain patterns are formed by the wet etching process using a same etchant.

11. The method of claim 1, wherein the first and second barrier patterns, the first and second conductive adhesive patterns and the semiconductor pattern are formed by a dry etching process.

12. The method of claim 11, wherein an etching gas for the dry etching process comprises chlorine or fluorine.

13. The method of claim 12, further comprising removing a metal oxide generated during the dry etching process.

14. The method of claim 13, wherein the metal oxide is removed due to reaction between the metal oxide and the etching gas.

15. A method of manufacturing a display apparatus, the method comprising:
    sequentially forming a gate electrode and a gate insulating layer on a first substrate;
    sequentially forming a semiconductor layer, a conductive adhesive layer, a barrier layer, a conductive thin layer and a capping layer on the gate insulating layer;
    partially etching the capping layer and the conductive thin layer to form a first capping pattern, a second capping pattern spaced apart from the first capping pattern, a source pattern and a drain pattern spaced apart from the source pattern on the gate electrode;
    partially etching the baffler layer and the conductive adhesive layer to form a first barrier pattern, a second barrier pattern spaced apart from the first barrier pattern, a first conductive adhesive pattern and a second conductive adhesive pattern spaced apart from the first conductive pattern on the gate electrode;
    forming a pixel electrode electrically connected to the drain electrode;
    forming a common electrode on a second substrate facing the first substrate; and
    forming a liquid crystal layer between the first and second substrates.

* * * * *